(12) United States Patent
Jeong

(10) Patent No.: US 8,730,748 B2
(45) Date of Patent: May 20, 2014

(54) SEMICONDUCTOR MEMORY APPARATUS EQUIPPED WITH AN ERROR CONTROL CIRCUIT FOR PREVENTING COUPLING NOISE

(75) Inventor: Young Han Jeong, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 62 days.

(21) Appl. No.: 13/604,504

(22) Filed: Sep. 5, 2012

(65) Prior Publication Data

US 2013/0141989 A1 Jun. 6, 2013

(30) Foreign Application Priority Data

Dec. 1, 2011 (KR) ........................ 10-2011-0127913

(51) Int. Cl.
*G11C 7/02* (2006.01)

(52) U.S. Cl.
USPC ........... 365/206; 365/203; 365/194; 365/228; 365/222; 365/230.03; 365/365; 365/230.08; 365/233.14; 365/233.19; 365/189.08

(58) Field of Classification Search
USPC ............. 365/230.03, 230.08, 233.14, 233.16, 365/233.17, 233.19, 189.08, 228, 226, 194, 365/203, 206, 222

See application file for complete search history.

(56) References Cited

U.S. PATENT DOCUMENTS

| | | | | |
|---|---|---|---|---|
| 5,835,414 | A * | 11/1998 | Hung et al. | 365/185.25 |
| 7,099,213 | B2 * | 8/2006 | Ju | 365/203 |
| 7,580,305 | B2 * | 8/2009 | Sumitani et al. | 365/203 |
| 8,018,775 | B2 * | 9/2011 | Oh | 365/185.22 |
| 8,270,227 | B2 * | 9/2012 | Park et al. | 365/189.05 |

* cited by examiner

*Primary Examiner* — Andrew Q Tran
(74) *Attorney, Agent, or Firm* — William Park & Associates Patent Ltd.

(57) ABSTRACT

A semiconductor memory apparatus includes a plurality of memory banks, wherein each memory bank includes a bank control unit configured to reduce a voltage level of a first node to a ground voltage level when the memory bank is selected to perform a predetermined operation; an error control unit configured to supply an external voltage to the first node when the memory bank is not selected to perform the predetermined operation; and a signal generation unit configured to generate a bank operation signal in response to the voltage level of the first node.

25 Claims, 5 Drawing Sheets

SEMICONDUCTOR MEMORY APPARATUS EQUIPPED WITH AN ERROR CONTROL CIRCUIT FOR PREVENTING COUPLING NOISE

CROSS-REFERENCES TO RELATED APPLICATION

The present application claims priority under 35 U.S.C. §119(a) to Korean application number 10-2011-0127913 filed on Dec. 1, 2011, in the Korean Intellectual Property Office, which is incorporated herein by reference in its entirety as set forth in full.

BACKGROUND

1. Technical Field

The present invention relates generally to a semiconductor memory apparatus, and more particularly, to a bank operation signal generation circuit.

2. Related Art

A semiconductor memory apparatus includes a plurality of memory banks, and each memory bank includes a bank operation signal generation circuit for receiving an internal command to generate a bank operation signal.

FIG. 1 is a block diagram of a general bank auto-precharge signal generation circuit included in each memory bank in a semiconductor memory apparatus.

The bank auto-precharge signal generation circuit illustrated in FIG. 1 includes a bank control unit 10, a signal generation unit 20, and a pulse control unit 30.

The bank control unit 10 reduces a voltage level of a first node NODE1 to a ground voltage VSS level in response to an auto-precharge command APCGCMD and an auto-precharge bank selection signal BA_APCG[n].

The auto-precharge command APCGCMD is an internal command input to all memory banks. When a read or write command including the auto-precharge command is input from an exterior, an control logic (not illustrated) automatically activates the auto-precharge command APCGCMD at a predetermined time point after a read or write operation is completed.

The auto-precharge bank selection signal BA_APCG[n] are signals generated by the control logic (not illustrated), and are generated according to the auto-precharge command included in the read or write command, and bank address information. Only an auto-precharge bank selection signal BA_APCG[n], which is input to a bank subject to auto-precharge, is activated.

The signal generation unit 20 receives the voltage level of the first node NODE1 to generate a bank auto-precharge signal APCG[n]. Since the first node NODE1 initially maintains a high voltage level, the signal generation unit 20 generates a deactivated bank auto-precharge signal APCG[n]. Then, if the voltage level of the first node NODE1 is reduced to a low voltage level, the signal generation unit 20 generates an activated bank auto-precharge signal APCG[n].

The pulse control unit 30 controls the voltage level of the first node NODE1 in response to the feedback bank auto-precharge signal APCG[n], thereby adjusting a pulse width of the bank auto-precharge signal APCG[n]. That is, at the time point at which the bank auto-precharge signal APCG[n] is activated and slightly delayed, the pulse control unit 30 supplies an external voltage VDD to the first node NODE1, thereby deactivating the bank auto-precharge signal APCG[n] again.

FIG. 2 is a signal waveform diagram illustrated with respect to a clock signal CLK as an example of the semiconductor memory apparatus including the bank auto-precharge signal generation circuit of FIG. 1.

[A] denotes signal waveforms of a bank selected by address information applied from an exterior.

An external write command WRITE0 is applied to a bank '0' and a read command READ7 is applied to a bank '7' after a predetermined time elapses. Thus, in the semiconductor memory apparatus, an auto-precharge command APCGCMD is activated at a predetermined time point after a write operation based on the write command WRITE0 and a read operation based on the read command READ7 is completed.

Furthermore, an auto-precharge bank selection signal BA_APCG[0] for the bank '0' is activated by the write command WRITE0, and an auto-precharge bank selection signal BA_APCG[7] for the bank '7' is activated by the read command READ7.

Thus, the bank control unit 10 included in the bank '0' changes the voltage level of the first node NODE1[0] to a low voltage level at the time point at which the auto-precharge command APCGCMD is activated and the auto-precharge bank selection signal BA_APCG[0] is activated.

The bank control unit 10 included in the bank '7' also changes the voltage level of the first node NODE1[7] to a low voltage level at the time point at which the auto-precharge command APCGCMD is activated and the auto-precharge bank selection signal BA_APCG[7] is activated.

As a consequence, the signal generation unit 20 and the pulse control unit 30 included in each bank operate, thereby generating the bank auto-precharge signal APCG[0] for the bank '0' having a predetermined pulse width and the bank auto-precharge signal APCG[7] for the bank '7' having a predetermined pulse width.

[B] denotes signal waveforms when an error occurs in a bank not selected by the address information applied from an exterior.

As described above, when the operation command is applied from an exterior, the bank auto-precharge signal should be generated by the bank selected by the address information.

However, a glitch caused by coupling noise and the like may occur in the auto-precharge bank selection signal BA_APCG[1] for an adjacent bank '1' due to the auto-precharge bank selection signal BA_APCG[0] for the bank '0'. In this case, the bank control unit 10 of the bank '1' may operate to reduce the voltage level of the first node NODE1 to a low voltage level, resulting in the generation of an abnormal bank auto-precharge signal APCG[1] for the bank '1'. This causes an erroneous operation of a corresponding bank.

Such an erroneous operation of a bank may occur both in the auto-precharge operation and various operations performed in the semiconductor memory apparatus in the units of a bank.

SUMMARY

In one embodiment of the present invention, a semiconductor memory apparatus including a plurality of memory banks, wherein each memory bank includes: a bank control unit configured to reduce a voltage level of a first node to a ground voltage level when the memory bank is selected to perform a predetermined operation; an error control unit configured to supply an external voltage to the first node when the memory bank is not selected to perform the predetermined operation; and a signal generation unit configured to generate a bank operation signal in response to the voltage level of the first node.

In one embodiment of the present invention, a semiconductor memory apparatus including a plurality of memory banks, wherein each memory bank includes: a bank control unit configured to reduce a voltage level of a first node to a ground voltage level in response to an internal command and an internal command bank selection signal that have both been activated; an error control unit configured to supply an external voltage to the first node in response to a bank active signal when the activated internal command is applied to the error control unit; and a signal generation unit configured to generate a bank operation signal in response to the voltage level of the first node.

In one embodiment of the present invention, a semiconductor memory apparatus including a plurality of memory banks, wherein each memory bank includes: a bank control unit configured to reduce a voltage level of a first node to a ground voltage level in response to an auto-precharge command and auto-precharge bank selection signal that have both been activated; an error control unit configured to supply an external voltage to the first node in response to a bank active signal when the activated auto-precharge command is applied to the error control unit; a signal generation unit configured to activate a bank auto-precharge signal according to the voltage level of the first node when the memory bank enters an active state and a minimum sensing guarantee time elapses; and a pulse control unit configured to supply the external voltage to the firs node in response to a bank auto-precharge signal that has been delayed.

BRIEF DESCRIPTION OF THE DRAWINGS

Features, aspects, and embodiments are described in conjunction with the attached drawings, in which.

DETAILED DESCRIPTION

Hereinafter, a semiconductor memory apparatus according to the present invention will be described in detail with reference to the accompanying drawings through various embodiments.

The figures are provided to allow those having ordinary skill in the art to understand the scope of the embodiments of the disclosure. The present invention may, however, be embodied in different forms and should not be construed as limited to the embodiments set forth herein. Rather, these embodiments are provided so that this disclosure will be thorough and complete, and will fully convey the scope of the present invention to those skilled in the art.

The drawings are not necessarily to scale and in some instances, proportions may have been exaggerated in order to clearly illustrate features of the embodiments. In this specification, specific terms have been used. The terms are used to describe the present invention, and are not used to qualify the sense or limit the scope of the present invention.

In this specification, 'and/or' represents that one or more of components arranged before and after 'and/or' is included. Furthermore, 'connected/coupled' represents that one component is directly coupled to another component or indirectly coupled through another component. In this specification, a singular form may include a plural form as long as it is not specifically mentioned in a sentence. Furthermore, 'include/comprise' or 'including/comprising' used in the specification represents that one or more components, steps, operations, and elements exists or are added.

Figure 1:
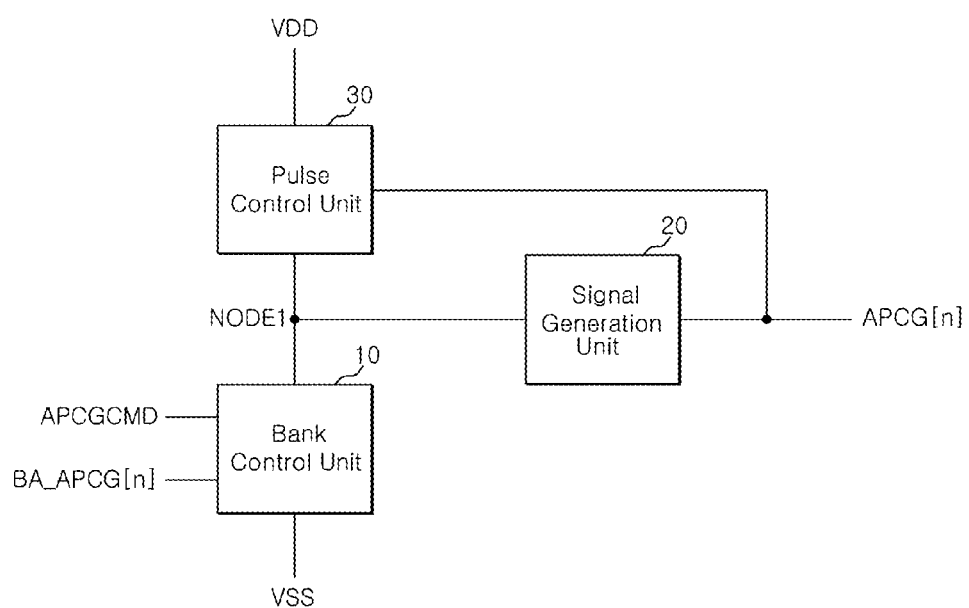
FIG. 1 is a block diagram of an example of a general bank auto-precharge signal generation circuit included in each memory bank in a semiconductor memory apparatus.
Figure 2:
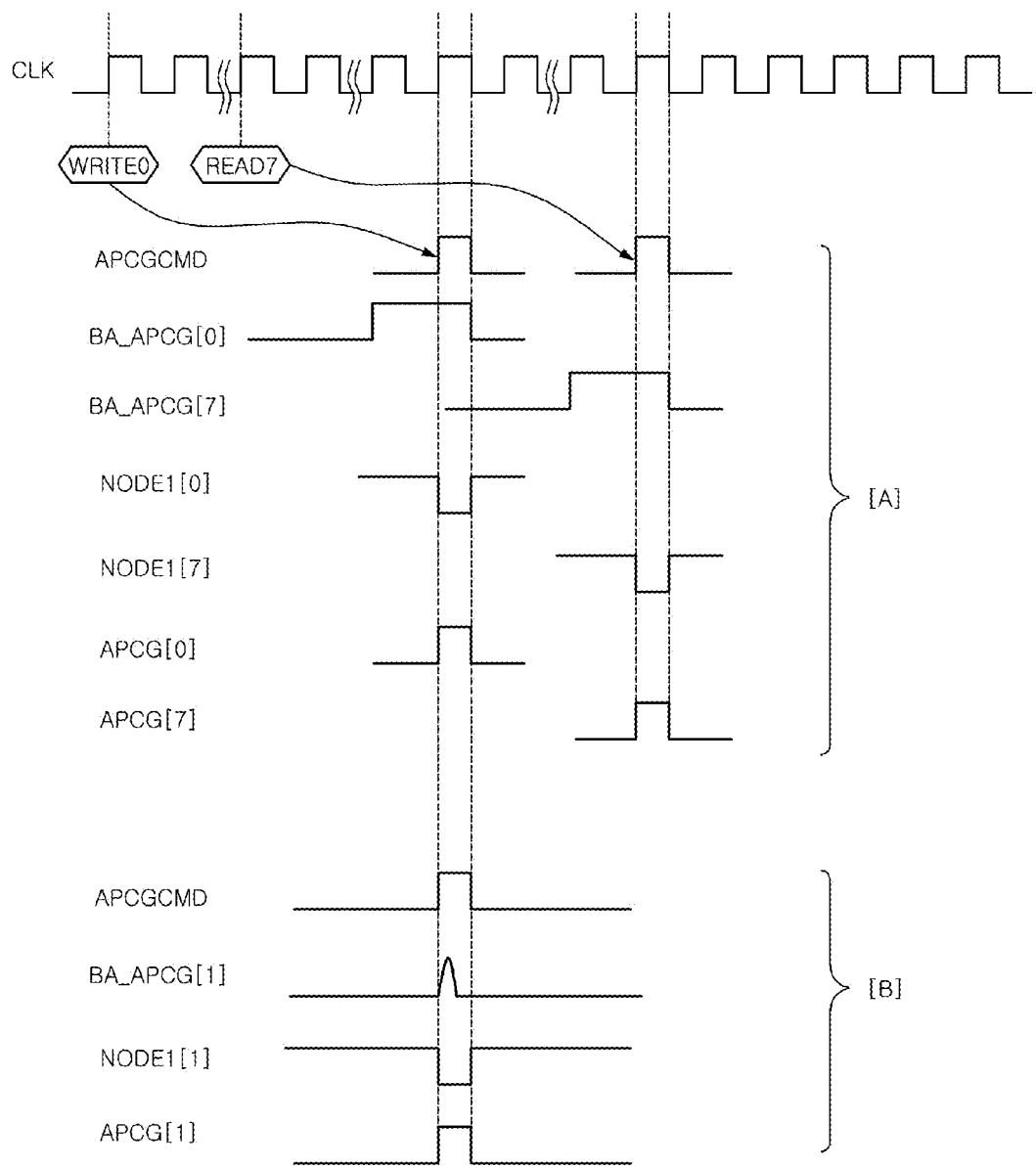
FIG. 2 is a signal waveform diagram of an example of a semiconductor memory apparatus including a bank auto-precharge signal generation circuit of FIG. 1.
Figure 3:
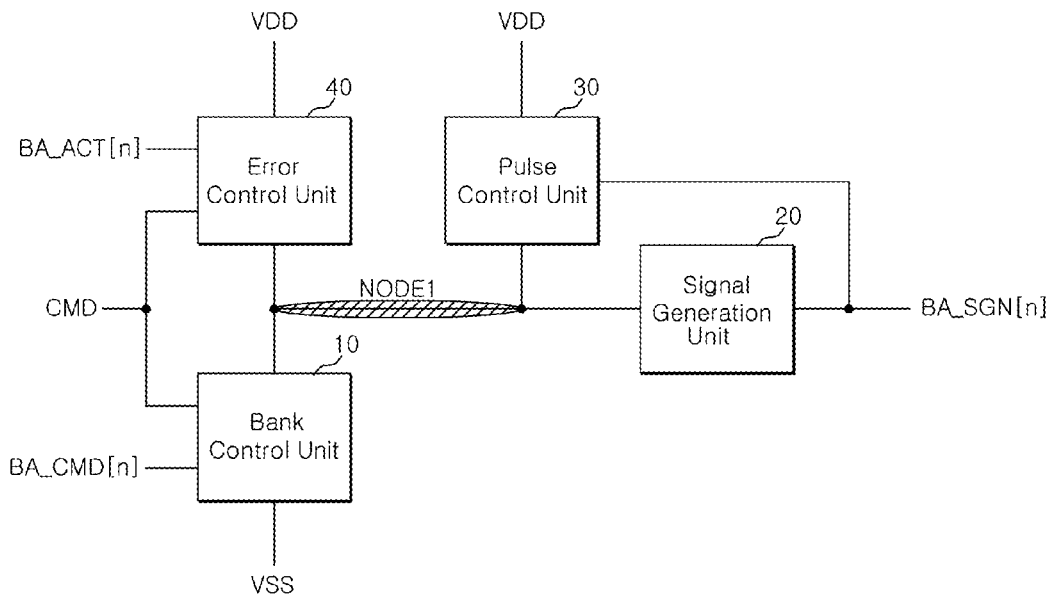
FIG. 3 is a block diagram of an example of a bank operation signal generation circuit included in each memory bank in a semiconductor memory apparatus according to an embodiment.

FIG. 3 is a block diagram of a bank operation signal generation circuit which may be included in each memory bank in a semiconductor memory apparatus including a plurality of memory banks according to an example of an embodiment.

The bank operation signal generation circuit which may be included in each memory bank may include a bank control unit 10, a signal generation unit 20, a pulse control unit 30, and an error control unit 40.

The bank control unit 10 may be configured to reduce a voltage level of a first node NODE1 to a ground voltage VSS level in response to an internal command CMD and an internal command bank selection signal BA_CMD[n].

The internal command CMD may be generated by a control logic (not illustrated) which receives a command from an exterior such that the semiconductor memory apparatus performs a predetermined operation, and may be commonly applied to all memory banks. The internal command CMD may include a precharge command, a refresh command and the like.

The internal command bank selection signal BA_CMD[n] may be generated by the control logic (not illustrated) which receives a bank address information included in the command from an exterior. Only an internal command bank selection signal BA_CMD[n], which is input to a bank for which a corresponding operation is performed, may be activated.

When activated internal command CMD and internal command bank selection signal BA_CMD[n] are input, the bank control unit 10 may reduce the voltage level of the first node NODE1 to the ground voltage VSS level.

The signal generation unit 20 may be configured to receive the voltage level of the first node NODE1 and generate a bank operation signal BA_SGN[n]. Since the first node NODE1 initially may maintain a high voltage level, the signal generation unit 20 may generate a deactivated bank operation signal BA_SGN[n]. Then, if the voltage level of the first node NODE1 is reduced to a low voltage level, the signal generation unit 20 may generate an activated bank operation signal BA_SGN[n].

The pulse control unit 30 may be configured to control the voltage level of the first node NODE1 in response to the feedback bank operation signal BA_SGN[n], thereby controlling a pulse width of the bank operation signal BA_SGN[n]. That is, at the time point at which the bank operation signal BA_SGN[n] is activated and delayed for a predetermined time, the pulse control unit 30 may supply an external voltage to the first node NODE1, thereby deactivating the bank operation signal BA_SGN[n] again.

When the activated internal command CMD is applied, the error control unit 40 may supply the external voltage VDD to the first node NODE1 in response to a bank active signal BA_ACT[n].

The activation of the bank active signal BA_ACT[n] input to the memory bank may be a precondition when a corresponding memory bank performs a predetermined operation. If an active command including address information is applied, the control logic (not illustrated) may store bank selection information for selecting a corresponding bank and activate the bank active signal BA_ACT[n]. Then, when a command for performing a predetermined operation is applied, the bank selection signal generation circuit may activate the internal command bank selection signal BA_CMD[n] using the stored bank selection information.

In order to substantially prevent an erroneous operation caused by a glitch due to noise and the like from occurring in the internal command bank selection signal BA_CMD[n], the error control unit 40 may use the bank active signal BA_ACT[n] which may be the basis of the internal command bank selection signal BA_CMD[n].

That is, even when the internal command bank selection signal BA_CMD[n] has been recognized to be activated due to a glitch and the like, if the bank active signal BA_ACT[n] is deactivated, the error control unit 40 may supply the external voltage VDD to the first node NODE1, thereby substantially preventing the first node NODE1 of a memory bank, which is not selected to perform a predetermined operation, from abnormally entering a low voltage level.

Figure 4:
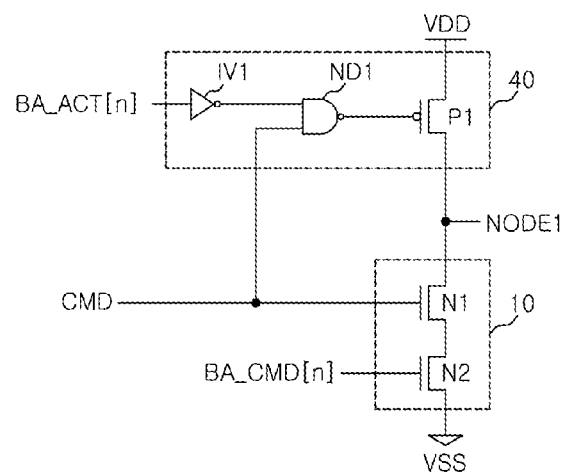
FIG. 4 is a detailed circuit diagram illustrating an example of a bank control unit and an error control unit of FIG. 3 according to an embodiment.

FIG. 4 is a circuit diagram illustrating an example of a bank control unit 10 and the error control unit 40 according to an embodiment.

The bank control unit 10 may include a first NMOS transistor N1 and a second NMOS transistor N2.

The first NMOS transistor N1 may have a drain terminal connected to the first node NODE1, a source terminal connected to a drain terminal of the second NMOS transistor N2, and a gate terminal for receiving the internal command CMD.

The second NMOS transistor N2 may have a drain terminal connected to the source terminal of the first NMOS transistor N1, a source terminal connected to a ground voltage VSS, and a gate terminal for receiving the internal command bank selection signal BA_CMD[n].

In the bank control unit 10, when the activated internal command CMD is input, the first NMOS transistor N1 may be turned on, and when the activated internal command bank selection signals BA_CMD[n] are input, the second NMOS transistor N2 may be turned on, so that the voltage level of the first node NODE1 may be reduced to the ground voltage VSS level.

The error control unit 40 may include a first inverter IV1, a first NAND gate ND1, and a first PMOS transistor P1.

The first inverter IV1 may receive the bank active signal BA_ACT[n], invert the bank active signal BA_ACT[n], and outputs an inverted bank active signal BA_ACT[n].

The first NAND gate ND1 may receive the output of the first inverter IV1 and the internal command CMD, perform a NAND operation on the received signals, and output a resultant signal.

The first PMOS transistor P1 may have a source terminal connected to the external voltage VDD, a drain terminal connected to the first node NODE1, and a gate terminal for receiving the output of the first NAND gate ND1.

When the deactivated internal command CMD is input, since the first NAND gate ND1 substantially may output a high voltage level, the first PMOS transistor P1 may be turned off. Meanwhile, when the activated internal command CMD is input, if the deactivated bank active signal BA_ACT[n] is received, since the first NAND gate ND1 may output a low voltage level, the first PMOS transistor P1 may be turned on. In this case, when a bank should not be selected to perform a predetermined operation but is erroneously selected due to noise, the error control unit 40 provides the first node NODE1 with the external voltage VDD, thereby substantially preventing the first node NODE1 from being erroneously reduced to a low voltage level. At this time, it may be necessary to set the current driving force P1 of the first PMOS transistor P1 to be larger than current driving force of the second NMOS transistor N2 because it may be possible to effectively maintain the voltage level of the first node NODE1 at a high voltage level.

Figure 5:
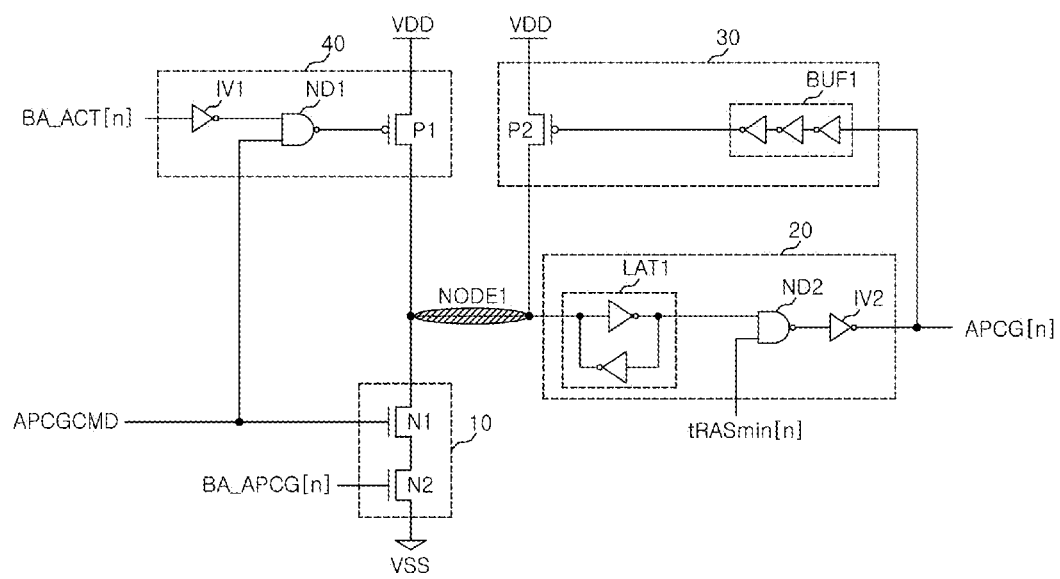
FIG. 5 is a detailed circuit diagram illustrating an example of a bank operation signal generation circuit of FIG. 3 according to an embodiment.

FIG. 5 is a circuit diagram illustrating an example of the bank operation signal generation circuit of FIG. 3 according to an embodiment, and is a circuit diagram illustrating an example of a bank auto-precharge signal generation circuit. The bank auto-precharge signal generation circuit may generate a bank auto-precharge signal APCG[n] as the bank operation signal BA_SGN[n].

The bank auto-precharge signal generation circuit may include the bank control unit 10, the signal generation unit 20, the pulse control unit 30, and the error control unit 40.

The bank control unit 10 may be configured to reduce the voltage level of the first node NODE1 to the ground voltage VSS level in response to an auto-precharge command APCGCMD and an auto-precharge bank selection signal BA_APCG[n].

In detail, the bank control unit 10 may include first and second NMOS transistors N1 and N2.

Similarly to the above, the first NMOS transistor N1 may have a drain terminal connected to the first node NODE1, a source terminal connected to a drain terminal of the second NMOS transistor N2, and a gate terminal for receiving the auto-precharge command APCGCMD.

The second NMOS transistor N2 may have a drain terminal connected to the source terminal of the first NMOS transistor N1, a source terminal connected to a ground voltage VSS, and a gate terminal for receiving the auto-precharge bank selection signal BA_APCG [ n].

In the bank control unit 10, when the activated auto-precharge command APCGCMD is input, the first NMOS transistor N1 may be turned on, and when the activated auto-precharge bank selection signal BA_APCG[n] is input, the second NMOS transistor N2 may be turned on, so that the voltage level of the first node NODE1 may be reduced to the ground voltage VSS level.

When the memory bank enters an active state and then a minimum sensing guarantee time elapses, the signal generation unit 20 may activate a bank auto-precharge signal APCG according to the voltage level of the first node NODE1.

The minimum sensing guarantee time may represent a sensing operation time which should be minimally guaranteed before a bank enters an active state and performs a precharge operation. This may be preset as an internal specification of a semiconductor.

In detail, the signal generation unit 20 may include a first latch section LAT1, a second NAND gate ND2, and a second inverter IV2.

The first latch section LAT1 may invert and latch the voltage level of the first node NODE1.

The second NAND gate ND2 may receive the output of the first latch section LAT1 and a sensing guarantee signal tRASmin[n], perform a NAND operation on the received signals, and output a resultant signal. The sensing guarantee signal tRASmin[n] may initially be maintained at a high voltage level, then changed to a low voltage level if the bank active signal BA_ACT[n] is activated, and then may be changed to the high voltage level again when the minimum sensing guarantee time elapses.

The second inverter IV2 may receive and invert the output of the second NAND gate ND2, and output an inverted signal as the bank auto-precharge signal APCG[n]. The second NAND gate ND2 and the second inverter IV2 do the same for an AND gate.

Since the first node NODE1 may initially maintain a high voltage level and the sensing guarantee signal tRASmin[n] may be maintained at a high voltage level, the signal generation unit 20 may generate a deactivated bank auto-precharge signal APCG[n]. Then, when the sensing guarantee signal tRASmin[n] is changed to a low voltage level in response to an activated bank active signal BA_ACT[n], may be changed to a high voltage level after the minimum sensing guarantee time elapses, and the voltage level of the first node NODE1 may be reduced to a low voltage level, the signal generation unit 20 may generate an activated bank auto-precharge signal APCG[n].

The pulse control unit 30 may be configured to control the voltage level of the first node NODE1 in response to the bank auto-precharge signal APCG[n], thereby controlling a pulse width of the bank auto-precharge signal APCG[n].

The pulse control unit 30 may include a first buffer section BUF1 and a second PMOS transistor P2.

The first buffer section BUF1 may receive the feedback bank auto-precharge signal APCG[n], delay the bank auto-precharge signal APCG[n] for a predetermined time, and output a delayed signal. The predetermined delay time may be adjusted, so that it may be possible to adjust the pulse width of the bank auto-precharge signal.

The second PMOS transistor P2 may have a source terminal connected to the external voltage VDD, a drain terminal connected to the first node NODE1, and a gate terminal for receiving the output of the first buffer section BUF1.

That is, at the time point at which the bank auto-precharge signal APCG[n] is activated and delayed for a predetermined time, the pulse control unit 30 may supply the external voltage VDD to the first node NODE1 to deactivate the bank auto-precharge signal APCG[n], thereby adjusting a pulse width of the bank auto-precharge signal APCG[n] again.

The error control unit 40 may include a first inverter IV1, a first NAND gate ND1, and a first PMOS transistor P1.

The first inverter IV1 may receive and invert the bank active signal BA_ACT[n], and output an inverted signal.

The first NAND gate ND1 may receive the output of the first inverter IV1 and the auto-precharge command APCGCMD, perform a NAND operation on the received signals, and output a resultant signal.

The first PMOS transistor P1 may have a source terminal connected to the external voltage VDD, a drain terminal connected to the first node NODE1, and a gate terminal for receiving the output of the first NAND gate ND1.

When the deactivated auto-precharge command APCGCMD is input, since the first NAND gate ND1 substantially outputs a high voltage level, the first PMOS transistor P1 may be turned off. Meanwhile, when the activated auto-precharge command APCGCMD is input, if the deactivated bank active signal BA_ACT[n] is received, since the first NAND gate ND1 may output a low voltage level, the first PMOS transistor P1 may be turned on. In this case, when a bank should not be selected to perform a predetermined operation but is erroneously selected due to noise, the error control unit 40 may provide the first node NODE1 with the external voltage VDD, thereby substantially preventing the first node NODE1 from being erroneously reduced to a low voltage level. At this time, it may be necessary to set current driving force P1 of the first PMOS transistor P1 to be generally larger than the current driving force of the second NMOS transistor N2 because it may be possible to effectively maintain the voltage level of the first node NODE1 at a high voltage level.

Figure 6:
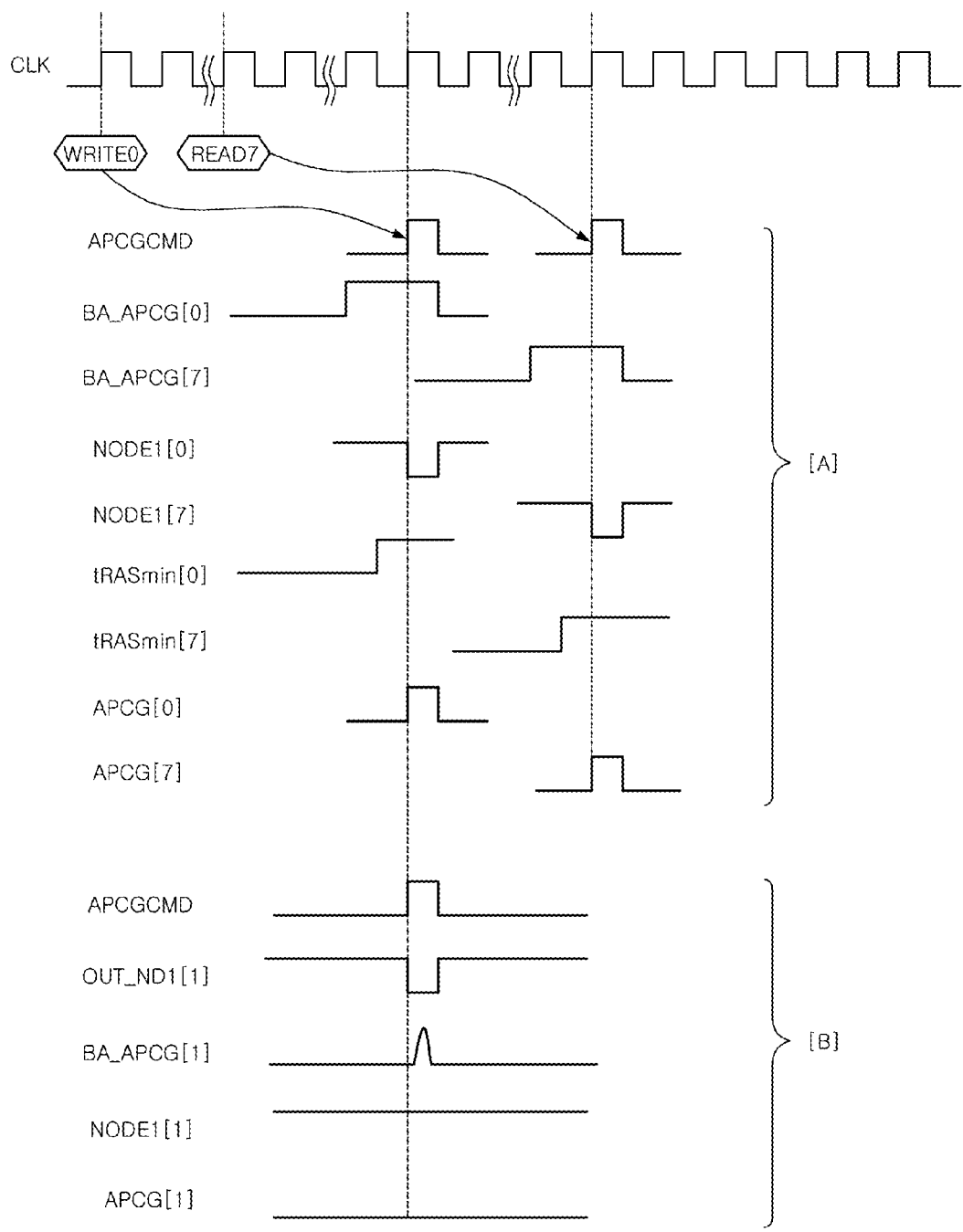
FIG. 6 is a signal waveform diagram of an example of a semiconductor memory apparatus including a bank operation signal generation circuit of FIG. 5.

FIG. 6 is a signal waveform diagram illustrated with respect to a clock CLK signal as an example of a semiconductor memory apparatus including the bank auto-precharge signal generation circuit.

[A] denotes signal waveforms of a bank selected by address information applied from an exterior.

An external write command WRITE0 may be applied to a bank '0' and a read command READ7 may be applied to a bank '7' after a predetermined time elapse. Thus, in the semiconductor memory apparatus, the auto-precharge command APCGCMD may be activated at a predetermined time point after the completion of a write operation based on the write command WRITE0 and a read operation based on the read command READ7.

Furthermore, the auto-precharge bank selection signal BA_APCG[0] for the bank '0' may be activated by the write command WRITE0, and the auto-precharge bank selection signal BA_APCG[7] for the bank '7' may be activated by the read command READ7.

Thus, the bank control unit 10 included in the bank '0' may change the voltage level of the first node NODE1[0] to a low voltage level at the time point at which the auto-precharge command APCGCMD is activated and the auto-precharge bank selection signal BA_APCG[0] is activated.

The bank control unit 10 included in the bank '7' also may change the voltage level of the first node NODE1[7] to a low voltage level at the time point at which the auto-precharge command APCGCMD is activated and the auto-precharge bank selection signal BA_APCG[7] is activated.

The sensing guarantee signals tRASmin[0] and [7] of each bank may be changed to a low voltage level if each bank enters an active state, and may be changed to a high voltage level again after the minimum sensing guarantee time elapses. As a consequence, the signal generation unit 20 and the pulse control unit 30 included in each bank operate, thereby generating the bank auto-precharge signal APCG[0] for the bank '0' having a predetermined pulse width and the bank auto-precharge signal APCG[7] for the bank '7' having a predetermined pulse width.

[B] denotes signal waveforms of a bank not selected by the address information applied from an exterior.

For example, the auto-precharge command APCGCMD may be activated, and the glitch caused by coupling noise and the like may have occurred in an auto-precharge bank selection signal BA_APCG[1] for an adjacent bank '1' due to the auto-precharge bank selection signal APCG[0] for the bank '0'. In this case, the bank control unit 10 of the bank '1' may operate to reduce the voltage level of the first node NODE1 to a low voltage level. However, since an output signal OUT_ND1[1] of a first NAND gate ND1 of an unselected bank '1' may be substantially maintained at a high voltage level and changed to a low voltage level, the first PMOS transistor P1 may be turned on, so that the external voltage may be supplied to the first node NODE1. Thus, the first node NODE1[1] may continuously maintain a high voltage level.

Consequently, according to the present embodiment, when an external operation command is applied, only a bank selected by address information may generate activated bank auto-precharge signals APCG[0] and [7], and an unselected bank normally may generate a deactivated bank auto-precharge signal APCG[1]. As a consequence, it is possible to substantially prevent an erroneous operation of the semiconductor memory apparatus.

While certain embodiments have been described above, it will be understood to those skilled in the art that the embodiments described are by way of example only. Accordingly, the semiconductor memory apparatus described herein should not be limited based on the described embodiments. Rather, the semiconductor memory apparatus described herein should only be limited in light of the claims that follow when taken in conjunction with the above description and accompanying drawings.

What is claimed is:

1. A semiconductor memory apparatus including a plurality of memory banks, wherein each memory bank comprises:
    a bank control unit configured to reduce a voltage level of a first node to a ground voltage level when the memory bank is selected to perform a predetermined operation;
    an error control unit configured to supply an external voltage to the first node when the memory bank is not selected to perform the predetermined operation; and
    a signal generation unit configured to generate a bank operation signal in response to the voltage level of the first node.

2. The semiconductor memory apparatus according to claim 1, wherein a driving force of the error control unit is set to be larger than a driving force of the bank control unit.

3. The semiconductor memory apparatus according to claim 2, wherein the signal generation unit is configured to activate the bank operation signal to a higher voltage level in response to the voltage level of the first node having a lower voltage level.

4. The semiconductor memory apparatus according to claim 3, further comprising:
    a pulse control unit configured to supply the external voltage to the first node in response to the bank operation signal being delayed for a predetermined time.

5. The semiconductor memory apparatus according to claim 1, wherein the predetermined operation includes a precharge operation.

6. The semiconductor memory apparatus according to claim 1, wherein the predetermined operation includes a refresh operation.

7. A semiconductor memory apparatus including a plurality of memory banks, wherein each memory bank comprises:
    a bank control unit configured to reduce a voltage level of a first node to a ground voltage level in response to an internal command and an internal command bank selection signal that have both been activated;
    an error control unit configured to supply an external voltage to the first node in response to a bank active signal when the activated internal command is applied to the error control unit; and
    a signal generation unit configured to generate a bank operation signal in response to the voltage level of the first node.

8. The semiconductor memory apparatus according to claim 7, wherein a driving force of the error control unit is set to be larger than a driving force of the bank control unit.

9. The semiconductor memory apparatus according to claim 7, wherein the bank control unit comprises:
    a first NMOS transistor configured to connect the first node to a second NMOS transistor in response to the internal command; and
    the second NMOS transistor configured to connect the first NMOS transistor to a ground voltage in response to the internal command bank selection signal.

10. The semiconductor memory apparatus according to claim 7, wherein, when the activated internal command is applied, if the bank active signal is in a deactivated state, the error control unit supplies the external voltage to the first node.

11. The semiconductor memory apparatus according to claim 10, wherein the error control unit comprises:
    a first NAND gate configured to receive the internal command and an inverted bank active signal; and
    a first PMOS transistor configured to supply the external voltage to the first node in response to an output of the first NAND gate.

12. The semiconductor memory apparatus according to claim 11, further comprising:
    the bank control unit having a first NMOS transistor configured to connect the first node to a second NMOS transistor in response to the internal command;
    the second NMOS transistor configured to connect the first NMOS transistor to a ground voltage in response to the internal command bank selection signal; and
    wherein a current driving force of the first PMOS transistor is set to be larger than a current driving force of the second NMOS transistor.

13. The semiconductor memory apparatus according to claim 12, further comprising:
    a pulse control unit configured to supply the external voltage to the first node in response to the bank operation signal being delayed for a predetermined time.

14. The semiconductor memory apparatus according to claim 7, wherein the signal generation unit is configured to activate the bank operation signal to a higher voltage level in response to the voltage level of the first node having a lower voltage level.

15. The semiconductor memory apparatus according to claim 7, wherein the internal command includes a precharge command, the internal command bank selection signal includes a precharge bank selection signal, and the bank operation signal includes a bank precharge signal.

16. The semiconductor memory apparatus according to claim 7, wherein the internal command includes a refresh command, the internal command bank selection signal includes a refresh bank selection signal, and the bank operation signal includes a bank refresh signal.

17. A semiconductor memory apparatus including a plurality of memory banks, wherein each memory bank comprises:
    a bank control unit configured to reduce a voltage level of a first node to a ground voltage level in response to an auto-precharge command and an auto-precharge bank selection signal that have both been activated;
    an error control unit configured to supply an external voltage to the first node in response to a bank active signal when the activated auto-precharge command is applied to the error control unit;
    a signal generation unit configured to activate a bank auto-precharge signal according to the voltage level of the first node when the memory bank enters an active state and a minimum sensing guarantee time elapses; and
    a pulse control unit configured to supply the external voltage to the first node in response to the bank auto-precharge signal that has been delayed.

18. The semiconductor memory apparatus according to claim 17, wherein a driving force of the error control unit is set to be larger than a driving force of the bank control unit.

19. The semiconductor memory apparatus according to claim 17, wherein the signal generation unit comprises:

a first latch section configured to invert and latch the voltage level of the first node; and an AND gate configured to receive the output of the first latch section and a sensing guarantee signal, and output the bank auto-precharge signal.

20. The semiconductor memory apparatus according to claim 19, wherein the sensing guarantee signal is substantially maintained at a high voltage level, is changed to a low voltage level when the bank active signal is activated, and is changed to the high voltage level again after the minimum sensing guarantee time elapses.

21. The semiconductor memory apparatus according to claim 17, wherein the bank control unit comprises:

a first NMOS transistor configured to connect the first node to a second NMOS transistor in response to the auto-precharge command; and the second NMOS transistor configured to connect the first NMOS transistor to a ground voltage in response to the auto-precharge bank selection signal.

22. The semiconductor memory apparatus according to claim 17, wherein, when the activated auto-precharge command is applied, if the bank active signal is in a deactivated state, the error control unit supplies the external voltage to the first node.

23. The semiconductor memory apparatus according to claim 22, wherein the error control unit comprises:

a first NAND gate configured to receive the auto-precharge command and an inverted bank active signal; and a first PMOS transistor configured to supply the external voltage to the first node in response to an output of the first NAND gate.

24. The semiconductor memory apparatus according to claim 23, further comprising:

the bank control unit including a first NMOS transistor configured to connect the first node to a second NMOS transistor in response to the auto-precharge command;

the second NMOS transistor configured to connect the first NMOS transistor to a ground voltage in response to the auto-precharge bank selection signal; and wherein a current driving force of the first PMOS transistor is set to be larger than a current driving force of the second NMOS transistor.

25. The semiconductor memory apparatus according to claim 17, wherein the pulse control unit comprises:

a first buffer section configured to invert and buffer the bank auto-precharge signal; and a second PMOS transistor configured to supply the external voltage to the first node in response to an output of the first buffer section.

* * * * *